United States Patent [19]

Tamamura

[11] Patent Number: 4,818,934
[45] Date of Patent: Apr. 4, 1989

[54] APPARATUS FOR MEASURING CHARACTERISTICS OF ELECTRONIC DEVICES

[75] Inventor: Hisashi Tamamura, Tokyo, Japan

[73] Assignee: Sony/Tektronix Corporation, Tokyo, Japan

[21] Appl. No.: 141,006

[22] Filed: Jan. 5, 1988

[30] Foreign Application Priority Data

Aug. 18, 1987 [JP] Japan .............................. 62-204924

[51] Int. Cl.$^4$ ............................................ G01R 31/22
[52] U.S. Cl. ............................ 324/158 T; 324/158 D; 324/158 R
[58] Field of Search ............. 324/158 R, 158 T, 73 R, 324/158 D; 331/21, 25

[56] References Cited

U.S. PATENT DOCUMENTS

| | | | |
|---|---|---|---|
| 2,577,803 | 12/1951 | Pfann | 324/158 T |
| 3,054,954 | 9/1962 | Boscia et al. | 324/158 T |
| 3,286,180 | 11/1966 | Hubbs | 324/158 T |
| 3,371,276 | 2/1968 | Schiff | 324/158 T |
| 3,707,677 | 12/1972 | Duncan | 324/158 T |
| 3,965,420 | 6/1976 | Bennett | 324/158 T |
| 4,127,887 | 11/1978 | Tanaka et al. | 324/158 T |
| 4,368,425 | 1/1983 | Adams | 324/158 T |
| 4,727,318 | 2/1988 | Sakai et al. | 324/158 T X |

Primary Examiner—Reinhard J. Eisenzopf
Assistant Examiner—Vinh P. Nguyen
Attorney, Agent, or Firm—Dellett, Smith-Hill and Bedell

[57] ABSTRACT

An electronic device measurement apparatus measures a characteristic of an electronic device under test (DUT) by applying a smoothly changing voltage from one terminal of a voltage supply to an ungrounded terminal of the DUT and detecting a current flowing through the DUT. The current flowing through the DUT does not include a looping error component. A current detection resistor is connected between another terminal of the voltage supply and a grounded terminal of the DUT. Since the voltage applied to the DUT is a sine squared wave voltage, the pure current flowing through the DUT is detected by detcting cosine-wave and sine-wave components from the ungrounded terminal of the DUT and obtaining the difference between the voltage across the current detection resistor and the cosine-wave and sine-wave components.

5 Claims, 6 Drawing Sheets

APPARATUS FOR MEASURING CHARACTERISTICS OF ELECTRONIC DEVICES

BACKGROUND OF THE INVENTION

The present invention relates to an apparatus for measuring characteristics of electronic devices, such as transistors, etc.

An electronic device measurement apparatus, generally known as a curve tracer, is useful for measuring characteristics of basic electronic devices, such as transistors, etc. The construction of a conventional curve tracer is shown in FIG. 4. FIG. 4 shows a floating collector supply circuit 10, which generates a collector voltage, for example by full-wave rectifying an AC voltage from an AC line voltage source, because it is necessary to apply only one polarity (positive or negative) of the voltage to a device under test (DUT) so that the DUT will be protected from destruction by a reverse bias voltage. The rectified voltage from the collector voltage supply circuit 10 is applied through a limiter resistor 16 to the collector of a transistor 18 as the DUT. The value of the resistor 16 is adjusted in accordance with a measurement range. A reference terminal of the collector voltage supply circuit 10 is connected through a current detection resistor 20 to the emitter of the transistor 18 under test as well as being grounded. The base of the transistor 18 receives a bias signal from a bias supply circuit 10, the bias signal being changed step by step. In FIG. 4, the transistor 18 under test is connected as a common emitter type to the curve tracer, however, a common base type or a common collector type may be available. A first voltage detection circuit 24 having a high input impedance detects the voltage V(CE) between the collector and the emitter of the transistor 18 under test and applies the detected voltage to the horizontal deflection plate of a cathode ray tube (CRT) 28 as a display device. A second voltage detection circuit 30 having a high input impedance detects the voltage across the resistor 20, i.e. a voltage corresponding to the collector current I(C) of the transistor 18 under test, and applies the detected voltage to the vertical deflection plate of the CRT 28. Thus, the CRT 28 can display a V(CE)-I(C) characteristic of the transistor 18.

In the electronic device measurement apparatus shown in FIG. 4, one terminal of the DUT, i.e. the emitter of the transistor 18, is grounded, so that the current from the bias supply circuit 22 is prevented from flowing through the current detection resistor 20. In other words, since the bias supply circuit 22 is grounded, the current from the bias supply circuit 22 comes back to the bias supply circuit 22 via the base-emitter junction of the transistor 18 and ground. Thus, a closed circuit is formed by the collector voltage supply circuit 10, the resistor 16, the collector-emitter path of the transistor 18 and the resistor 20, and thereby only the collector current of the transistor 18 will flow through the resistor 20. In addition, the circuit of FIG. 4 has the advantage that the voltage detection circuits 24 and 30 do not need to be floated, since the emitter of the transistor 18 is grounded. It should be noted that if the current detection resistor 20 is inserted in the collector side of the transistor 18, the voltage detection circuit 30 must be floated. In this instance, the circuit may be complex in construction.

There is stray capacitance in an electronic circuit. Similarly, there is stray capacitance as shown by dotted capacitors 15 and 17 in the electronic device measurement apparatus of FIG. 4. These stray capacitors 15 and 17 are representatively shown, and in fact the stray capacitance is distributed throughout the entire measurement apparatus. Thus, a part of the output current from the collector voltage supply circuit 10 flows to ground through the stray capacitors 15 and 17, and the current returns to the collector voltage supply circuit 10 from ground via the current detection resistor 20. Therefore, the current flowing through the resistor 20 comprises not only the collector current of the transistor 18 but also the currents flowing through the stray capacitors 15 and 17, so that an error occurs when detecting the collector current from the voltage across the resistor 20. It should be noted that the output voltage waveform from the collector voltage supply circuit 10 is the full-wave rectified waveform of a sine-wave (AC line voltage waveform) in the conventional electronic device measurement apparatus shown in FIG. 4. Since the full-wave rectified waveform changes rapidly at ground level, the error may be the maximum at ground level and levels near it. The collector current detection error based on the stray capacitance is called a looping error.

Conventional techniques to reduce this looping error are proposed in the 576 curve tracer manufactured by Tektronix, Inc., Beaverton, Oreg. One of the conventional techniques is a guard technique which encloses the collector voltage supply circuit 10 and the resistor 16 with a conductor and applies the voltage at the left terminal of the resistor 20 to the conductor. However, the looping error cannot be eliminated completely by the guard technique alone. Thus, the 576 curve tracer also uses a looping compensation circuit as shown in FIG. 5 for further reducing the looping error. In FIG. 5, the looping compensation circuit comprises variable capacitors 31 and 33 for the stray capacitors 15 and 17 and also a resistor 35. The resistor 35 is inserted between the resistor 20 and the voltage detection circuit 30. Each of the capacitors 31 and 33 has one terminal connected to the right terminal of the resistor 35. The other terminals of the capacitors 31 and 33 are connected to the left and right terminals respectively of the resistor 16. The value of the resistor 35 is the same as that of the resistor 20. The capacitors 31 and 33 are adjusted such that the currents flowing through the capacitors 31 and 33 become equal to the currents flowing through the stray capacitors 15 and 17, respectively. The currents flowing from the collector voltage supply circuit 10 through the capacitors 31 and 33 return to the collector voltage supply circuit 10 via the resistor 35. (It should be noted that the input impedance of the voltage detection circuit 30 is very high.) Thus, the voltage across the resistor 35 produced by the current flowing through the capacitors 31 and 33 is the same as the voltage across the resistor 20 produced by the currents flowing through the stray capacitors 15 and 17. Since the polarities of these voltages are opposite with respect to the input terminal of the voltage detection circuit 30, these voltages are cancelled. Therefore, the circuit of FIG. 5 can compensate the looping error based on the current flowing through the resistor 20 from the stray capacitors 15 and 17.

As mentioned above, the stray capacitance is distributed throughout the entire electronic device measurement apparatus, and the phase of the current flowing through each portion of the stray capacitance is different from each other. Thus, a large number of variable capacitors, similar to the capacitors 31 and 33 shown in FIG. 5, must be provided in a looping compensation circuit. All the capacitors must be variable, because the stray capacitance is different in every electronic device measurement apparatus even if all the electronic device measurement apparatuses are the same in construction. It is necessary to adjust a large number of the variable capacitors to compensate the looping error, and the adjustment is very complex.

The output voltage from the collector voltage supply circuit 10 is the full-wave rectified waveform (FIG. 6B) of a sine-wave, so that this waveform changes rapidly and includes high frequency components around ground level. Thus, the error current based on ground and near ground levels of the full-wave rectified waveform is much larger than the error current at other levels of the full-wave rectified waveform. Because the looping error compensation circuit employing variable capacitors cannot completely compensate the looping error current, the error at each point on the characteristic curves (displayed on the CRT 28) is different from the error at each other point. The measurement accuracy is determined by the worst error, and the overall measurement accuracy may therefore be reduced.

It is, therefore, one object of the present invention to provide an improved electronic device measurement apparatus which improves looping error compensation by a large margin.

It is another object of the present invention to provide an improved electronic device measurement apparatus which can compensate looping error by an easy adjustment.

SUMMARY OF THE INVENTION

An electronic device measurement apparatus of the present invention comprises a voltage supply means for supplying a voltage to one terminal of a DUT having a grounded terminal and an ungrounded terminal, the voltage being of a single polarity and changing smoothly, a current detection resistor inserted between the grounded terminal of the DUT and the voltage supply means, a first voltage detection means for detecting the voltage across the current detection resistor, and a second voltage detection means for detecting the voltage across the DUT. Since the voltage from the voltage supply means changes smoothly at ground and the levels near ground, high frequency components of the voltage are reduced and the current flowing through stray capacitance also is reduced. Thus, the looping error current flowing through the current detection resistor can be reduced.

The smoothly changing voltage of a single polarity can be produced by generating an AC voltage waveform changing smoothly at ground and levels near it, applying the AC voltage to the primary winding of a transformer, and rectifying the AC voltage at the secondary winding of the transformer. The voltage can be increased by the transformer to a large voltage, such as 3 kv, so that a high power device can be tested.

The smoothly changing voltage of a single polarity may be a sine squared (sine**2) waveform voltage. In this instance, the electronic device measurement apparatus of the present invention may further include a first detection means for detecting one of sine and cosine components at the ungrounded terminal of the DUT, a second detection means for detecting the other of the sine and cosine components at the ungrounded terminal of the DUT, and a difference detection means for obtaining the difference between the voltage across the current detection resistor and the voltages of the sine and cosine components detected by the first and second detection means. In the present invention, the term "sine squared waveform voltage" includes a cosine squared waveform voltage, because the latter is the same as the former except for its phase.

A sine squared voltage $A^*((\sin wt)^{**}2)$, where "A" represents amplitude, does not include a rapidly changing portion in comparison with the full-wave rectified waveform of the sine wave, so that the current flowing through the stray capacitance does not change rapidly. Thus, the worst error current flowing through the current detection resistor is reduced by a large margin in comparison with the case in which the voltage applied to the DUT is a full-wave rectified sine-wave. Therefore, the measurement accuracy is improved.

In the preferred embodiment of the invention, the voltage applied to the DUT is a sine squared voltage. Since $$A^*((\sin wt)^{**}2) = A(1 - \cos 2wt)/2,$$

the sine squared voltage is equivalent to an offset cosine wave (cos 2wt). If a reference point is assigned to any point in the electronic device measurement apparatus, the phase of the voltage at any other selected point leads or lags with respect to the voltage at the reference point and it is proportional to cos (2wt−a), where "a" represents a positive or negative phase difference between the selected point and the reference point. Since $$\cos (2wt - a) = (\cos 2wt)^*(\cos a) + (\sin 2wt)^*(\sin a)$$

and (cos a) and (sin a) are constant values at the selected point in the measurement apparatus, the voltage at the selected point consists of a (cos 2wt) component, a (sin 2wt) component and a DC component, regardless of the position of the selected point. Thus, in the preferred electronic device measurement apparatus embodying the present invention, all the current flowing through the stray capacitance consists of only the sine-wave (sin 2wt) component and the cosine-wave (cos 2wt) component. The first and second detection means detect these sine-wave and cosine-wave components, respectively from the ungrounded terminal of the DUT or any point connected to the ungrounded terminal of the DUT. The difference detection means obtains the difference between the voltage across the current detection resistor and the sum of the sine-wave and cosine-wave components so that the looping error can be compensated. In the preferred embodiment of the present invention, it is easy to make the adjustments that are necessary in order to achieve compensation of the looping error, because only two components, namely, the sine-wave and cosine-wave components, are processed.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings.

DRAWINGS

FIG. 1 is a block diagram of a preferred embodiment of the present invention,

FIG. 2 is a detailed block diagram of a collector voltage supply circuit used in the FIG. 1 embodiment, FIG. 3 is a circuit diagram of an AC generator used in the FIG. 2 collector voltage supply circuit, FIGS. 4 and 5 are block diagrams of conventional electronic device measurement apparatuses, and FIG. 6 depicts a time chart for explaining the operations of the present invention and the prior art.

In the different figures, like reference characters refer to corresponding elements.

DETAILED DESCRIPTION

Figure 1:
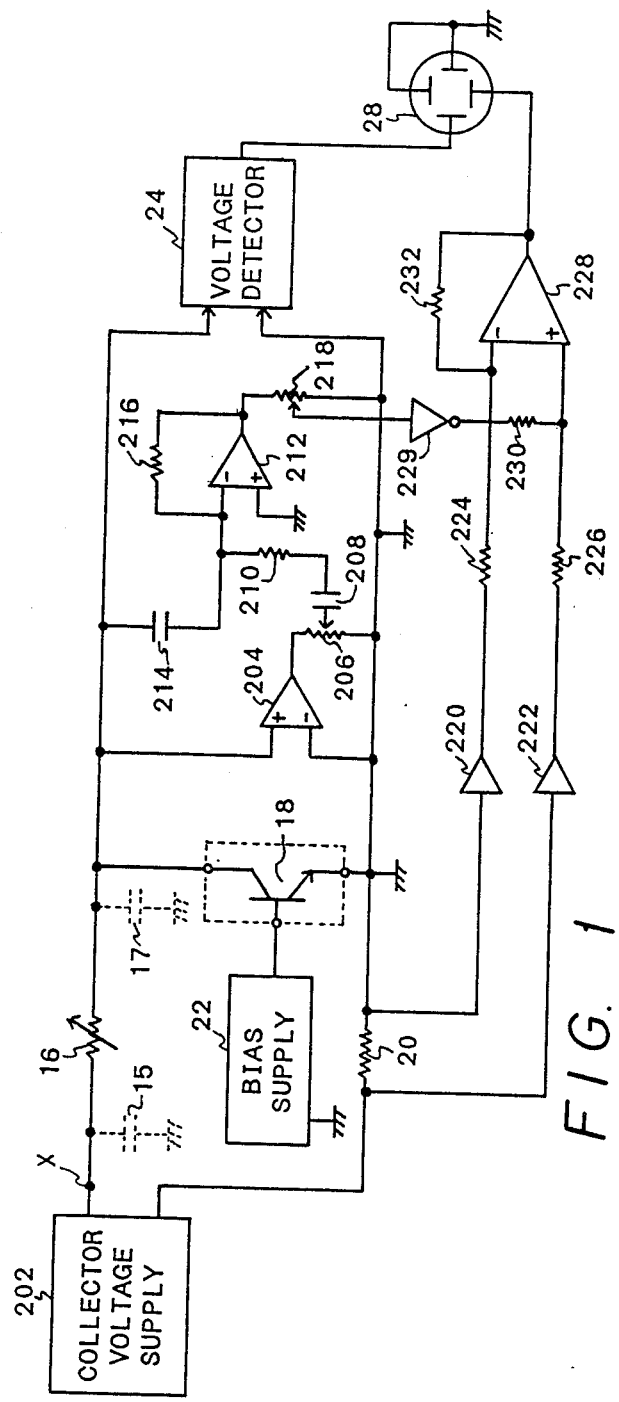

The apparatus shown in FIG. 1 comprises a collector voltage supply circuit 202 as a voltage supply means for supplying a smoothly changing voltage of a single polarity to the collector of the transistor 18, which constitutes the DUT. The circuit 202 is a floating circuit which generates a sine squared wave voltage (sin $wt$)**2. The collector voltage supply circuit 202 will be discussed in detail hereinafter with reference to FIGS. 2, 3 and 6. It is preferable that the sine squared wave voltage has the same frequency as, or twice the frequency of, the AC line voltage and is in phase with the AC line voltage. The output voltage from the collector voltage supply circuit 202 is applied through the variable limiter resistor 16 to the collector of the transistor 18. Similarly to the prior art, the base of the transistor 18 receives the step bias voltage from the bias supply circuit 22, and the emitter thereof is grounded and further connected through the collector current detection resistor 20 to the other terminal of the collector voltage supply circuit 202. Thus, the main current path of the collector voltage supply circuit 202 consists of the resistor 16, the collector-emitter path of the transistor 18 and the resistor 20. The high input impedance voltage detection circuit 24 detects the voltage between the collector and the emitter of the transistor 18, and supplies the detected voltage to the horizontal deflection plate of the CRT 28. The values of the resistors 16 and 20 are adjusted in due consideration of the measurement range. The stray capacitance is distributed through the entire measurement apparatus of FIG. 1, but only the stray capacitors 15 and 17 are shown representatively.

As discussed hereinbefore, the collector voltage supply circuit 202 generates the sine squared wave voltage. Since $$A^*((\sin wt)^{**}2) = A(1 - \cos 2wt)/2,$$

the voltage applied to the collector of the transistor 18 may be the cosine-wave component (cos $2wt$) in essence. Assuming that the collector of the transistor 18 is a reference point, the voltage at any point X between the collector and the collector voltage supply circuit 202 is proportional to cos $(2wt-a)$, where "a" represents the phase difference between the reference point and the point X, if the offset component (DC voltage component) is ignored. Since $$\cos(2wt-a) = (\cos 2wt)^*(\cos a) + (\sin 2wt)^*(\sin a)$$

and (cos $a$) and (sin $a$) are constant values at the point X, the voltage at the point X consists of the DC component, the sine-wave component (sin $2wt$) and the cosine-wave component (cos $2wt$) regardless of the position of the point X. Thus, the error current consists of the sum of only the sine-wave and cosine-wave components, and flows from the collector voltage supply circuit 202 through the stray capacitors 15 and 17, ground and the current detection resistor 20. It should be noted that the DC component cannot flow through the stray capacitors.

A differential amplifier 204 detects the collector voltage at the transistor 18. Since the collector of this transistor 18 is assumed as the reference point, the differential amplifier 204 equivalently detects the cosine-wave component. The output voltage from the differential amplifier 204 is adjusted by a potentiometer 206 having, for example, a resistance of 10 k-ohms, and the adjusted output voltage is applied through a capacitor 208 and a resistor 210 to the inverting input terminal of an operational amplifier 212. The capacitor 208 eliminates the DC component of the voltage detected by the differential amplifier 204, so that only the cosine-wave component is applied to the operational amplifier 212. The values of the capacitor 208 and the resistor 210 are, for example, 0.1 micro-F and 1 M-ohms, respectively, and the time constant is very large so that the cosine-wave component from the differential amplifier 204 is practically constant in phase. The differential amplifier 204 and the capacitor 208 form a first detection means.

In order to obtain the sine-wave component at the collector of the transistor 18, a capacitor 214 is inserted between the collector of the transistor 204 and the inverting input terminal of the operational amplifier 212. The value of the capacitor 214 is small, e.g. 20 pF. The phase of the cosine-wave component at the collector of the transistor 18 is therefore shifted by ninety degrees so as to provide the sine-wave component. This capacitor 214 acts as a second detection means.

The non-inverting input terminal of the operational amplifier 212 is grounded, and a feedback resistor 216 having a resistance of, for example, 100 k-ohms is connected between the inverting input terminal and the output terminal of the operational amplifier 212. Thus, the operational amplifier 212 adds the cosine-wave component from the large capacitor 208 and the sine-wave component from the small capacitor 214. The amplitude of the added output voltage is adjusted by a potentiometer 218 having a resistance of 10 k-ohms. The potentiometer 206 adjusts the ratio of the sine-wave component to the cosine-wave component, and the potentiometer 218 adjusts the amplitude of the sum of the sine-wave and cosine-wave components.

The terminals of the current detection resistor 20 are connected through respective buffer amplifiers 220 and 222 and resistors 224 and 226 to the inverting and non-inverting input terminals respectively of an operational amplifier 228. The center tap of the potentiometer 218 is connected through an inverting amplifier 229 and a resistor 230 to the non-inverting terminal of the operational amplifier 228, and a feedback resistor 232 is inserted between the inverting input terminal and the output terminal of the operational amplifier 228. The output terminal of the operational amplifier 228 is connected to the vertical deflection plate of the CRT 28. For example, the resistances of the resistors 224, 226, 230 and 232 are 10 k-ohms. The operational amplifier 228 therefore provides an output signal representing the sum of the voltage across the resistor 20 and the inverted output voltage from the potentiometer 218. Thus, the operational amplifiers 212 and 228 and the inverting amplifier 229 operate as a difference detection means which provides the difference between the voltage across the resistor 20 and the sum of the cosine-wave and sine-wave components detected by the first and second detection means. By adjusting the potentiometers 206 and 218 properly, the operational amplifier 228 produces at its output terminal a voltage in which the error voltage based on the looping is compensated, and this output voltage is linearly related to the collector current of the transistor 18 and does not include a looping error component. Since the output voltage from the collector voltage supply circuit 202 is a sine squared wave voltage, the output voltage does not include components that vary rapidly, similarly to the full-wave rectified sine-wave. Thus, the looping current is substantially constant at every level thereof, and the error current can be compensated well. Therefore, the I(C)-V(CE) characteristic of the transistor 18 is displayed more accurately on the CRT 28.

Figure 2:
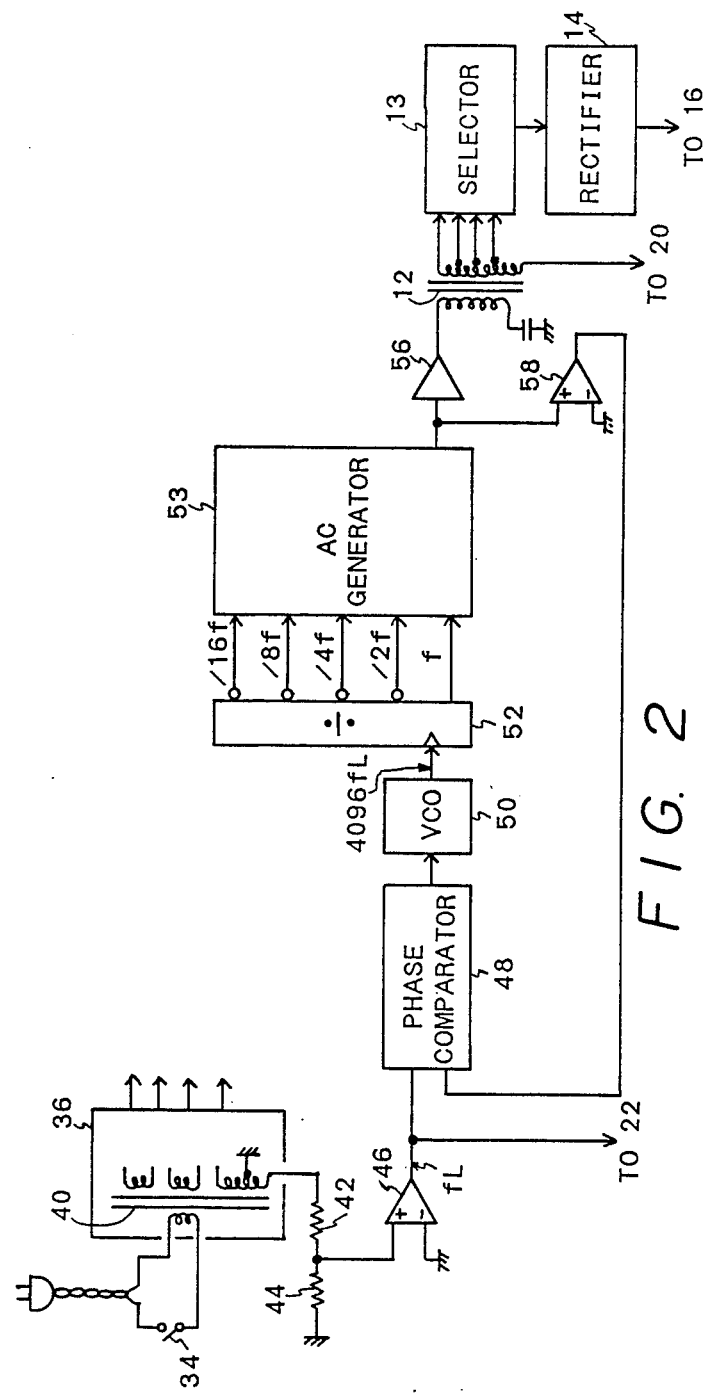
Figure 3:
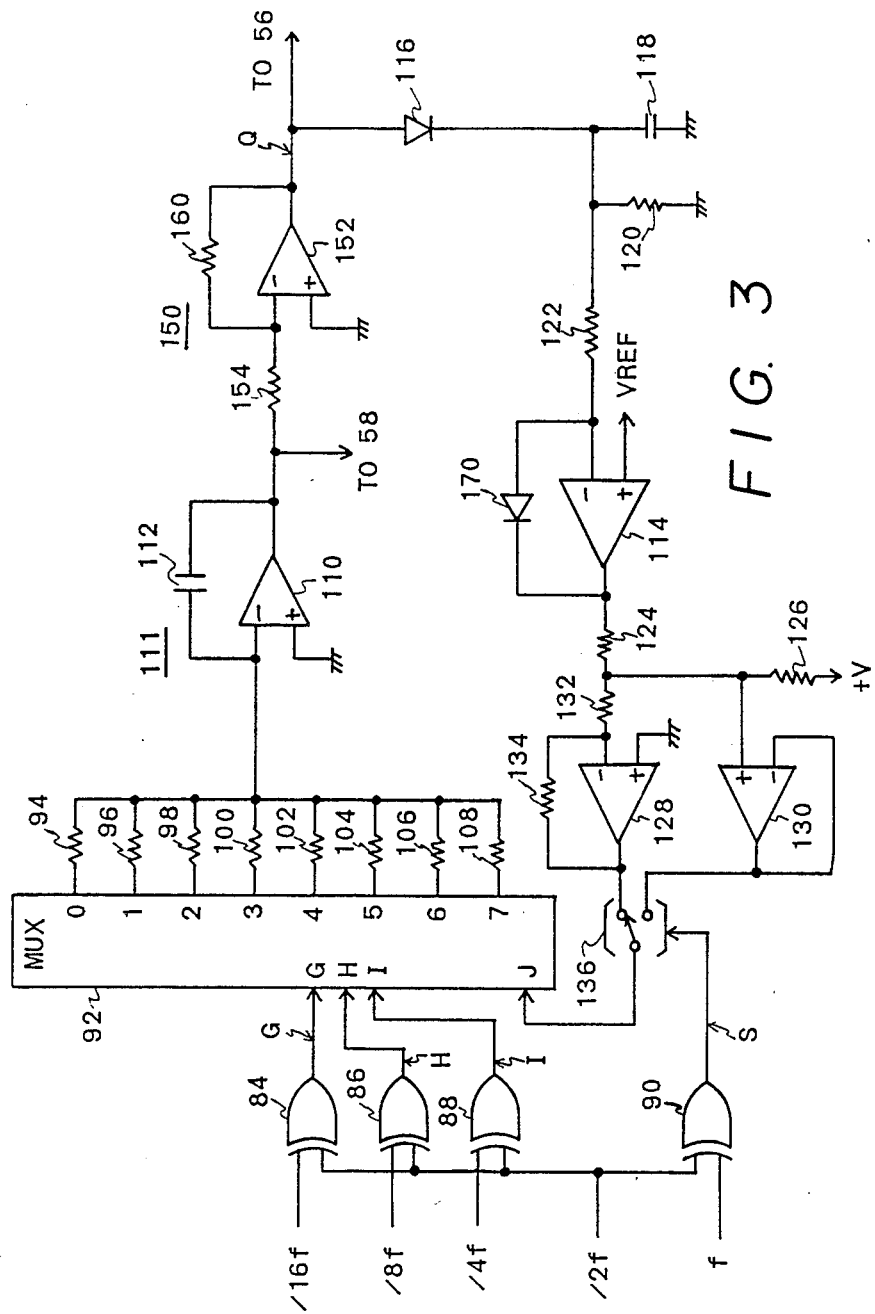
Figure 4:
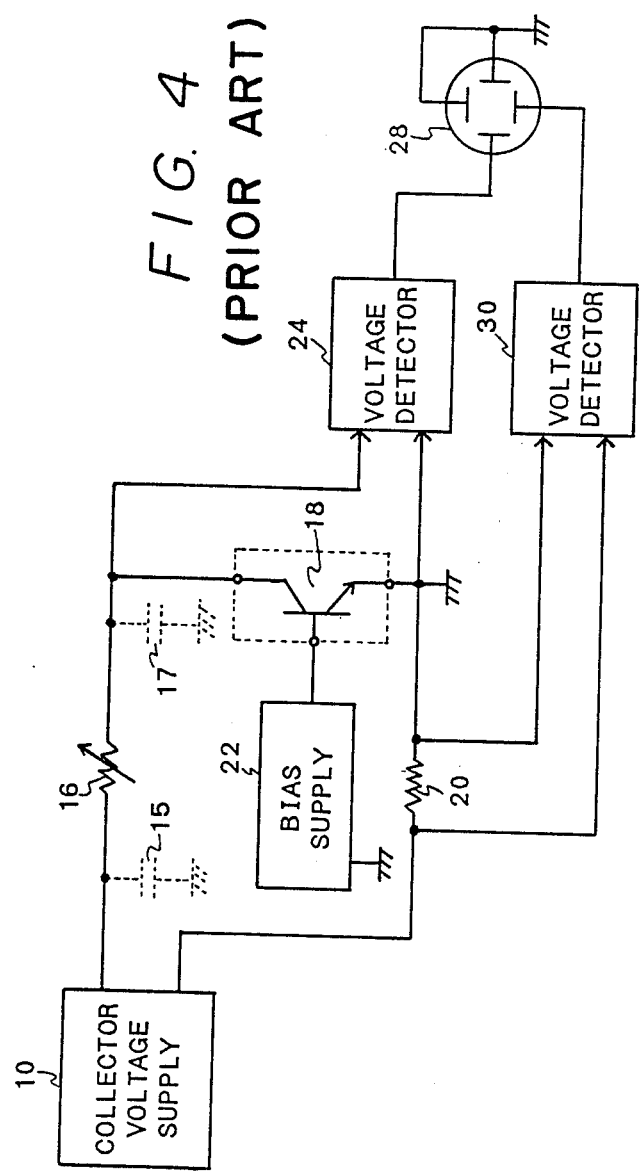
Figure 5:
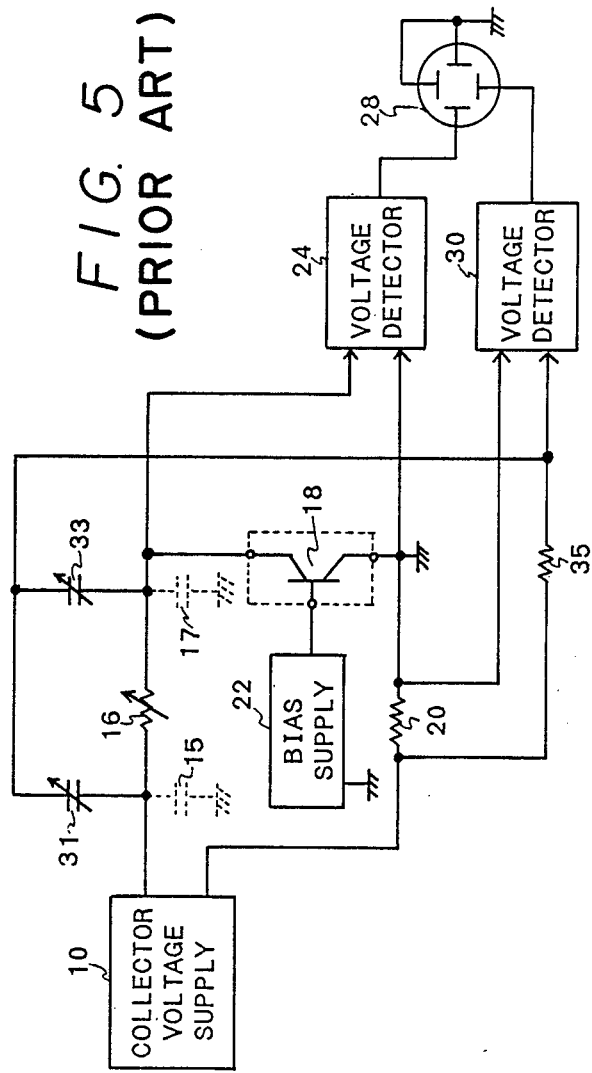
Figure 6:
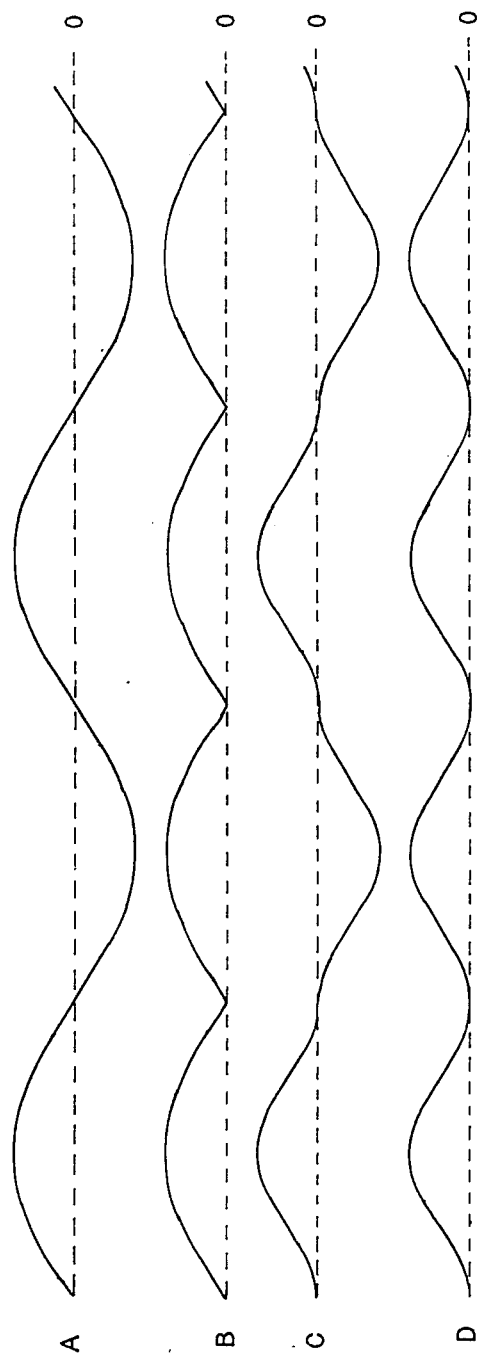

The collector voltage supply circuit 202 will be described with reference to FIGS. 2, 3 and 6. FIG. 2 is an entire block diagram of the preferred collector voltage supply circuit 202. An AC voltage is applied from a line AC voltage source through a switch 34 to the primary winding of a transformer 40 in a power supply circuit 36. A plurality of secondary windings of the transformer 40 are connected to the DC voltage regulator circuits (not shown) in the power supply circuit 36 which apply the DC voltages to various circuits in the electronic device measurement apparatus. The AC voltage at the secondary winding of the transformer 36 at the lowest position is divided by resistors 42 and 44 with respect to ground level. A voltage comparator 46 compares the divided AC voltage with ground voltage, and generates a pulse signal fL which is inverted every time the AC voltage crosses ground voltage. It should be noted that the frequency and the phase of the pulse fL are the same as the AC line voltage.

A variable frequency oscillator (voltage controlled oscillator or VCO) 50 operating as a pulse oscillator has an oscillator frequency $2^{}n$ (n is a positive integer) times the frequency of the pulse signal fL, e.g. 4096 ($=2^{}12$) times the pulse signal fL. The output signal (4096fL) is applied to a clock terminal of a counter or a frequency divider 52. The frequency divider 52 divides the frequency of the output signal from the VCO 50 so as to generate signals /16f, /8f, /4f, /2f and f whose frequencies are sixteen, eight, four, two and one times the pulse signal fL, respectively. The slash symbol ("/") indicates a signal that is inverted in phase with respect to the input signal to the frequency divider 52.

The output pulses /16f, /8f, /4f, /2f and f are applied to an AC generator 53 for generating an AC voltage (see FIG. 6C) of which alternate half cycles are a cycle of a sine squared wave and an inverted cycle of a sine squared wave. The AC generator 53 will be discussed in detail hereinafter with reference to FIG. 3. The AC voltage from the AC generator 53 is applied to the primary winding of a transformer 12 through an amplifier 56 and to a voltage comparator 58 directly. The comparator 58 compares the AC voltage with ground voltage and generates a pulse signal whose level is inverted every time when the AC voltage crosses ground voltage. Thus, this pulse signal is equal to the AC voltage from the AC generator 53 in frequency and phase.

A phase comparator 48 compares the phases of the pulse signal fL from the comparator 46 with the pulse signal from the comparator 58, and controls the oscillation frequency of the VCO 50 in response to the comparison result such that these pulse signals are maintained in phase with each other. Since a phase-locked loop is formed by the phase comparator 48, the VCO 50, the frequency divider 52, the AC generator 53 and the voltage comparator 58, the AC voltage from the AC generator 53 is in phase with the AC line voltage regardless of the phase characteristics of the AC generator 53 (and the frequency divider 52).

The pulse signal fL from the comparator 48 is applied to the bias supply circuit 22 in FIG. 1. This bias supply circuit consists of a digital-to-analog converter and digital circuits, such as a counter, and produces the step bias voltage in synchronism with the AC line voltage.

The output voltage at the secondary winding of the transformer 12 is similar to the voltage waveform at the primary winding except with respect to its amplitude: the output voltage is an AC voltage of which alternate half cycles are a cycle of a sine squared wave and an inverted cycle of a sine squared wave. A selection circuit 13 selects a proper tap of the secondary winding of the transformer 12, and the AC voltage from the selected tap is full-wave rectified by a rectifier circuit 14 which may be a conventional type rectifier composed of diodes. The full-wave rectified voltage waveform is the sine squared wave voltage as shown in FIG. 6D, and it does not include portions varying rapidly as the voltage waveform shown in FIG. 6B. It should be noted that the collector voltage supply circuit 202 generates a floating sine squared wave voltage, since the secondary side of the transformer 12 is floating.

One example of the AC generator 53 will be discussed by reference to FIG. 3. This AC generator 53 generates the AC voltage of which alternate half cycles are a cycle of a sine squared wave and an inverted cycle of a sine squared wave. The output pulses /16f, /8f, /4f, /2f and f from the frequency divider 52 are applied to an encoder which consists of four exclusive OR (XOR) gates 84 through 90. The XOR gate 84 receives the pulses /16f and /2f, the XOR gate 86 receives the pulses /8f and /2f, the XOR gate 88 receives pulses /4f and /2f, and the XOR gate 90 receives pulses /2f and f. Thus, the phase of the output pulse S from the XOR gate 90 is delayed by ninety degrees with respect to the pulse f, namely, fL, and the output pulses G, H and I from the XOR gates 84, 86 and 88 form a three-bit digital signal changing sequentially from "000" to "111" and from "111" to "000" every ninety degrees (a quarter period) of the pulse S.

An analog multiplexer (MUX) 92 is a first selection means for selectively connecting an input terminal J to one of eight output terminals 0 through 7 in response to the digital signals G through H from the XOR gates 84 through 88. The output terminal 0 is selected when the signals at the terminals G through I are "000", the output terminal 1 is selected when the signals are "001", and the output terminal 2 is selected when the signals are "010". Similarly, the output terminals 3, 4, 5, 6, and 7 are selected respectively by "011", "100", "101", "110" and "111". The output terminals 0 through 7 of the multiplexer 92 are connected through respective resistors 94 through 108 to the input terminal of an integrator 111. This integrator 111 comprises an operation amplifier 110. The non-inverting input terminal of the operation amplifier 110 is grounded and a capacitor 112 is connected between its inverting input terminal and its output terminal. Thus, the integrator comprises a Miller integrator whose input resistor is one of the resistors 94 through 108 selected by the multiplexer 92. By way of example, the values of the resistors 94 through 108 are respectively 154.0 k-ohms, 51.1 k-ohms, 31.5 k-ohms, 23.7 k-ohms, 19.1 k-ohms, 16.9 k-ohms, 15.4 k-ohms and 15.0 k-ohms, while the value of the capacitor 112 is 0.1 micro-F. As being described hereinafter, the voltage or the polarity at the input terminal J of the multiplexer 92 changes every quarter period of the output pulse f and the resistors 94 through 108 are selected in sequence, so that different currents are applied (charged or discharged) to the capacitor 112 in sequence and the integrator 111 generates at the output terminal thereof the AC voltage shown in FIG. 6C.

The AC voltage from the Miller integrator 111 is applied to the comparator 58 in FIG. 2 and to a unity gain inverting amplifier 150 consisting of an operational amplifier 152 and resistors 154 and 160. The output signal Q from the amplifier 150 is applied to a voltage comparator 114 via a peak detector comprising a diode 116, a resistor 120 and a capacitor 118. The voltage comparator 114 compares the peak value of the output signal Q with a reference voltage VREF, a difference output voltage therefrom is divided by resistors 124 and 126, and the divided voltage is applied to an inverting amplifier 128 and a non-inverting amplifier 130. The inverting amplifier 128 has input and feedback resistors 132 and 134 that are equal in value to each other. An electronic switch 136 (second selection means) selectively applies the output voltage from the unity gain inverting amplifier 128 or the output voltage from the unity gain non-inverting amplifier 130 to the input terminal J of the multiplexer 92. The electronic switch 136 is controlled by the pulse signal S. A diode 170 connected between the inverting input terminal and the output terminal of the comparator 114 prevents the comparator 114 from operating improperly when the output voltage becomes lower than the voltage at the inverting input terminal.

For the first quarter period, the switch 136 applies the output signal from the non-inverting amplifier 130 to the input terminal J of the multiplexer 92. Since this first quarter period is equally divided by eight and the resistors 94 through 108 are selected in sequence in accordance with the pulse signals G through I, the output signal Q is half of the sine squared wave. During the second quarter period, the output voltage from the inverting amplifier 128 is applied to the input terminal J of the multiplexer 92. This interval is divided by eight and the resistors 108 through 94 are selected in sequence. The circuit operates similarly as described hereinbefore and the output signal Q from the integrator 111 becomes the AC voltage (FIG. 6C) which is synchronized with the AC line voltage. The waveform shape of the output signal Q comprises in alternating fashion a cycle of a sine squared wave and an inverted cycle of a sine squared wave. Since the input voltage to the integrator 111 is controlled by the peak detector 116 through 122 and the voltage comparator 114 so as to maintain the peak amplitude of the AC voltage Q, this amplitude is not affected by the variation of the line voltage frequency and amplitude. Moreover, in this example of FIG. 3, the amplitude of the AC voltage Q is kept constant regardless of the voltage variation of the AC line voltage and the AC voltage Q is synchronized with the AC line voltage, so that the measurement of the electronic devices is not affected by the variation of the AC line voltage.

As described hereinbefore, a smoothly changing voltage is applied to the DUT, so that the error current flowing through the current detection resistor from the stray capacitance does not change by a large margin. Thus, a stable compensation can be accomplished for the looping error. In addition, the sine squared wave voltage can be used as the smoothly changing voltage. This sine squared wave voltage comprises a DC component, a cosine-wave component and a sine-wave component. The DC component does not flow through the stray capacitance, so that it is easy to adjust in order to achieve compensation of the looping error because only the cosine-wave and sine-wave components detected by the first and second detection means need to be adjusted.

While I have shown and described herein the preferred embodiment of my invention, it will be appreciated that many changes and modifications may be made without departing from my invention in its broader aspects. For example, if the first and second detection means receive the input signals from the same point, the second detection means may be an inductor instead of a capacitor because the object of the second detection means is to shift the phase of the input signal by ninety degrees. Moreover, if the output voltage from the voltage supply means is stable, the second detection means may be a delay circuit for delaying the input signal by ninety degrees of a quarter cycle. In the preferred embodiment, the difference detection means comprises the three amplifiers. However, the difference means may be various kinds of summing means or subtracting (differential) means. The amplitudes of the output signals from the first and second detection means may be adjusted independently. This amplitude adjustment is possible by controlling the gains of the amplifiers. The reference point may be selected to be any point connected to an ungrounded terminal of the DUT. Therefore, the scope of the present invention should be determined by the following claims.

I claim:

1. An apparatus for measuring characteristics of electronic devices, comprising:
    voltage generation means having first and second output terminals, for generating a sine-squared voltage at said first output terminal, the voltage being applied to a first terminal of an electronic device under test with a second terminal thereof being grounded,
    a current detection resistor connected between said second terminal of said electronic device under test and said second output terminal of said voltage generation means,
    first voltage detection means for detecting a voltage between said first and second terminals of said electronic device under test,
    second voltage detection means for detecting a voltage across said current detection resistor,
    first detection means for detecting one of a sine-wave component and a cosine-wave component at a point connected to said first terminal of said electronic device under test, and
    second detection means for detecting the other of the sine-wave component and the cosine-wave component at a point connected to said first terminal of said electronic devices under test,
    wherein said second voltage detection means produces the difference between the voltage across said current detection resistor and the sum of the output voltages from said first and second detection means.

2. An apparatus according to claim 1, wherein said first detection means is an AC coupling path.

3. An apparatus according to claim 2, wherein said AC coupling path is a capacitor having a large capacitance.

4. An apparatus according to claim 1, wherein said second detection means is a capacitor having a small capacitance.

5. An apparatus for measuring characteristics of electronic devices, comprising:
   voltage generation means having first and second output terminals, for generating at said first output terminal a sine squared wave voltage for application to a first terminal of an electronic device under test with a second terminal thereof being grounded,
   a current detection resistor connected between said second terminal of said electronic device under test and said second output terminal of said voltage generation means,
   first detection means for detecting one of a sine-wave component and a cosine-wave component at a point connected to said first terminal of said electronic device under test,
   second detection means for detecting the other one of the sine wave component and the cosine-wave component at said point connected to said first terminal of said electronic device under test, and
   difference detection means for providing the difference between the voltage across said current detection resistor and the output voltages from said first and second detection means.

* * * * *